(12) United States Patent
Gao et al.

(10) Patent No.: US 12,635,103 B2
(45) Date of Patent: May 19, 2026

(54) CABINET FOR CARRYING TWO LAYERS OF MOTHERBOARDS WITH FACILITATED MAINTENANCE AND SERVER THEREOF

(71) Applicant: Fulian Precision Electronics (Tianjin) Co., LTD., Tianjin (CN)

(72) Inventors: Ying Gao, Tianjin (CN); Gong-Wen Zhang, Tianjin (CN); Han-Yu Li, New Taipei (TW); Zhen-Lei Li, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 122 days.

(21) Appl. No.: 18/733,646

(22) Filed: Jun. 4, 2024

(65) Prior Publication Data

US 2025/0247992 A1     Jul. 31, 2025

(30) Foreign Application Priority Data

Jan. 26, 2024     (CN) ........................ 202410115667.X

(51) Int. Cl.
H05K 7/14 (2006.01)
G06F 1/184 (2026.01)
(52) U.S. Cl.
CPC .......... H05K 7/1487 (2013.01); G06F 1/184 (2013.01)

(58) Field of Classification Search
CPC .............................. H05K 7/1487; G06F 1/184
See application file for complete search history.

(56) References Cited

U.S. PATENT DOCUMENTS 11,439,033 B2 * 9/2022 Mao ...................... H05K 7/1457
12,436,579 B2 * 10/2025 Lu ........................... G06F 1/184

FOREIGN PATENT DOCUMENTS

CN          117032410 A      11/2023
CN          117234290 A    * 12/2023

* cited by examiner

*Primary Examiner* — James Wu
(74) *Attorney, Agent, or Firm* — ScienBiziP, P.C.

(57) ABSTRACT

A cabinet of a server includes a chassis with a bottom sheet for carrying a lower motherboard and an electronic device, and a bracket positioned above the bottom sheet for carrying an upper motherboard. The bracket is rotatable and slidable relative to the chassis. When rotated upward, the bracket exposes the lower motherboard for maintenance. When rotated downward, the upper motherboard overlays the lower motherboard, allowing the bracket to slide toward the electronic device for connection. The chassis further includes a top sheet, side sheets forming a cavity, and inner sheets with sliding grooves having horizontal and vertical sections to guide the bracket's shafts. A rotatable handle on the bracket facilitates lifting and locking, enabling easy assembly and disassembly of the top sheet.

12 Claims, 12 Drawing Sheets

100(200)

100

30

50    34    40    11

CABINET FOR CARRYING TWO LAYERS OF MOTHERBOARDS WITH FACILITATED MAINTENANCE AND SERVER THEREOF

FIELD

The disclosure herein generally relates to information computing systems, and more particularly relates to a cabinet and a server.

BACKGROUND

Servers in recent days demands larger capacity and faster running speed, so more motherboards are required in servers. However, space within the server is standard, so motherboards must fit in a narrow space in the serve. Therefore, maintenance of motherboards is difficult.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
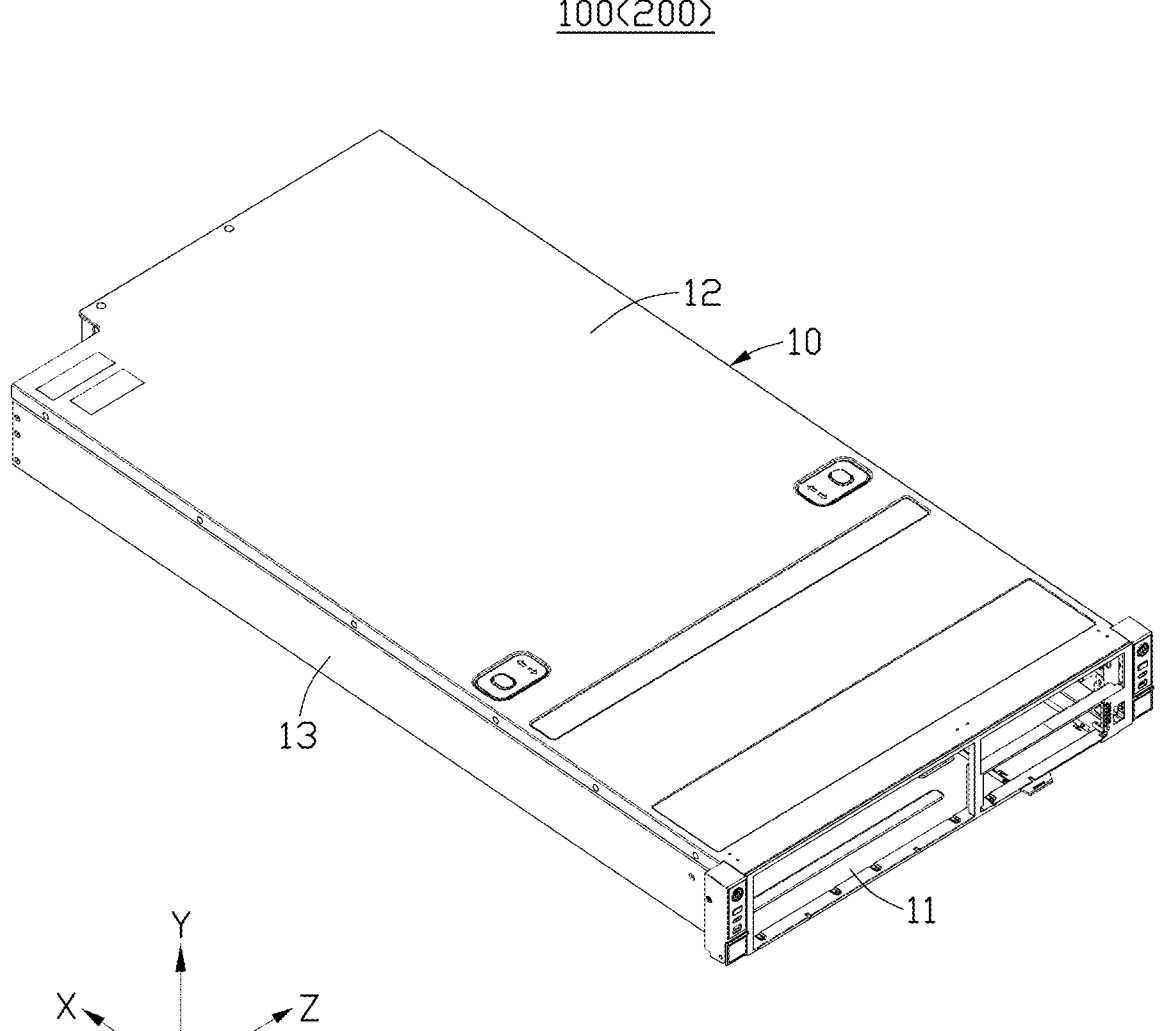
FIG. 1 is an isometric view of an embodiment of a server with a cabinet according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to;" it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

When testing storage cards, the storage cards are usually inserted directly into the interface of a mother board one by one, and after finishing the test, the storage cards need to be removed from the interface of the mother board. However, after the interface is inserted multiple times by storage cards, the interface may be damaged, causing damage to the mother board.

As shown in FIG. 1 to FIG. 12, a server 100 in an embodiment includes a cabinet 200, a lower motherboard 20, an upper motherboard 40, and an electronic device 50. The cabinet 200 holds the lower motherboard 20, the upper motherboard 40, and the electronic device 50 insides. The lower motherboard 20 and the upper motherboard 40 need to be connected to the electronic device 50. For example, the electronic device 50 is a power distribution board.

The cabinet 200 includes a chassis 10 and a bracket 30. The chassis 10 includes a bottom sheet 11. The lower motherboard 20 and the electronic device 50 are carried on the bottom sheet 11, and the lower motherboard 20 and the electronic device 50 are connected. The bracket 30 is rotatably and movably mounted on the chassis 10 and the bracket 30 is located above the lower motherboard 20. The upper motherboard 40 is carried on the bracket 30. When the bracket 30 is rotated up, the lower motherboard 20 is exposed for maintenance. When the bracket 30 is rotated down, the upper motherboard 40 is layered above the lower motherboard 20, and then the bracket 30 can be moved towards the electronic device 50 in direction X to connect the upper motherboard 40 with the electronic device 50. When the bracket 30 is moved away from the electronic device 50, the bracket 30 is disconnected with the electronic device 50, then the bracket 30 can be rotated up to expose the lower motherboard 20.

Figure 2:
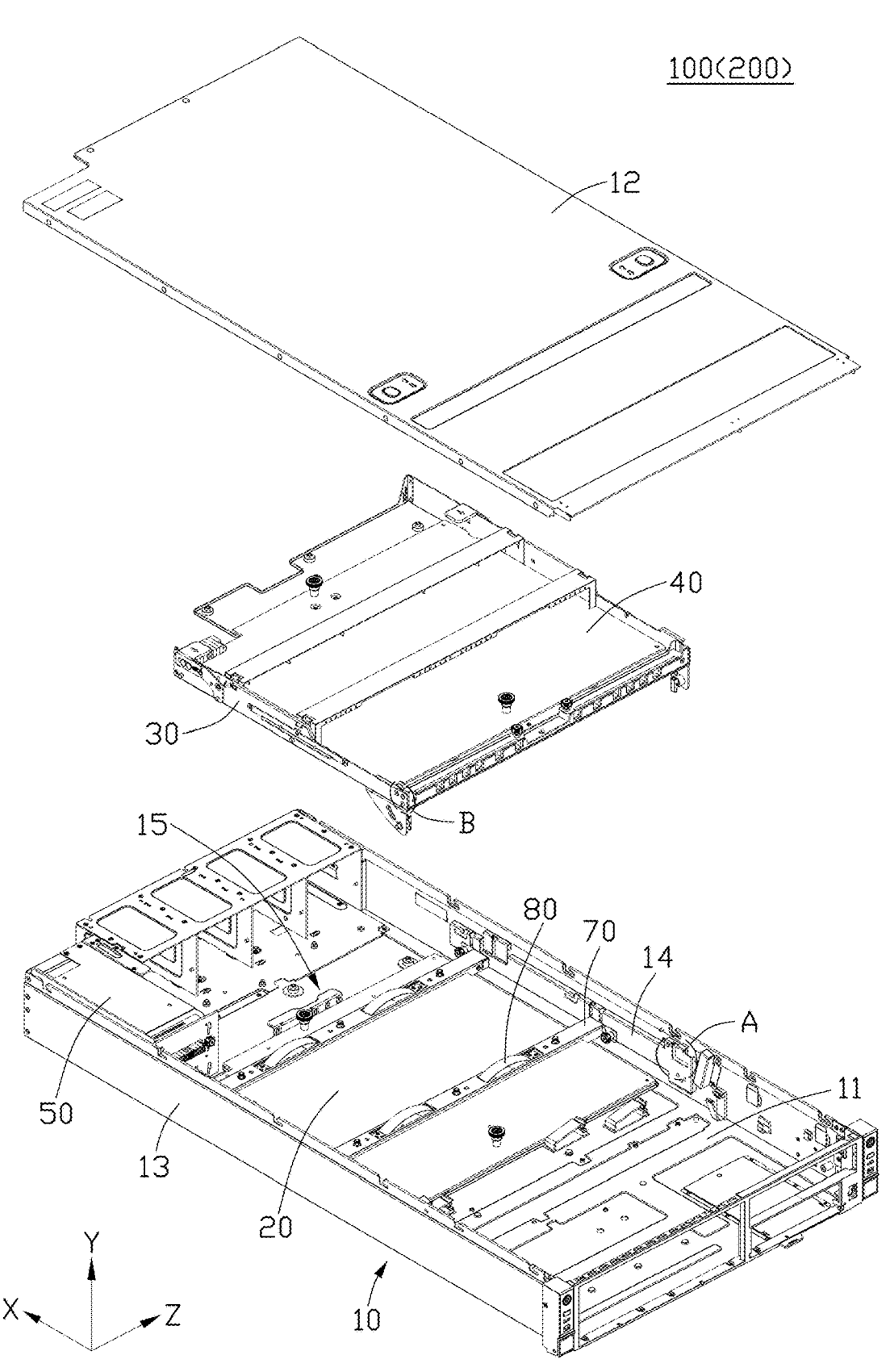
FIG. 2 is an exploded view of the server shown in FIG. 1.
Figure 3:
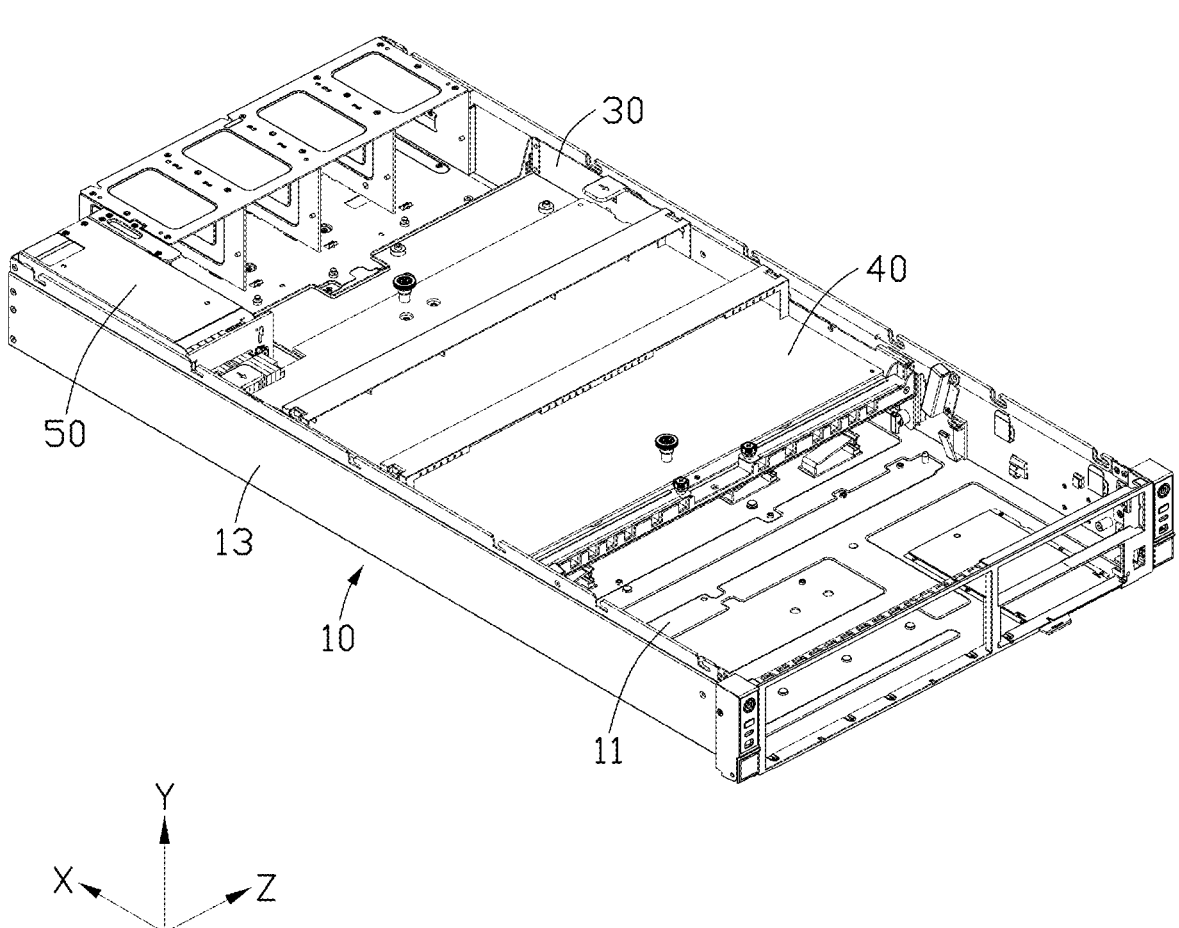
FIG. 3 is an isometric view of the server shown in FIG. 2, showing a bracket rotated down.

In some embodiments, as shown in FIG. 1 to FIG. 3, the cabinet 200 further includes a top sheet 12 and two side sheet 13. The two side sheets 13 are located on two opposite sides of the bottom sheet 11, respectively. The top sheet 12 is mounted on the two side sheets 13. The top sheet 12, the bottom sheet 11, and the two side sheets 13 forms a cavity 15 to accommodate the bracket 30, the lower motherboard 20, the upper motherboard 40, and the electronic device 50.

As shown in FIG. 2 and FIG. 3, the bottom sheet 11, the top sheet 12, the lower motherboard 20, and the upper motherboard 40 are parallel in the cavity 15, so the lower motherboard 20 and the upper motherboard 40 are layered in the cavity 15, improving space utilization of the cavity 15. When the lower motherboard 20 or the upper motherboard 40 needs maintenance, users remove the top sheet 12, so the upper motherboard 40 is exposed for maintenance, then users move the bracket 30 away from the electronic device 50 and rotate up the bracket 30 to expose the lower motherboard 20 for maintenance. Thus, the lower motherboard 20 can be maintained without disassembling the upper motherboard 40, thereby reducing the maintenance difficulty.

In some embodiments, the lower motherboard 20 is fixed on the bottom sheet 11 by screws.

Figure 4:
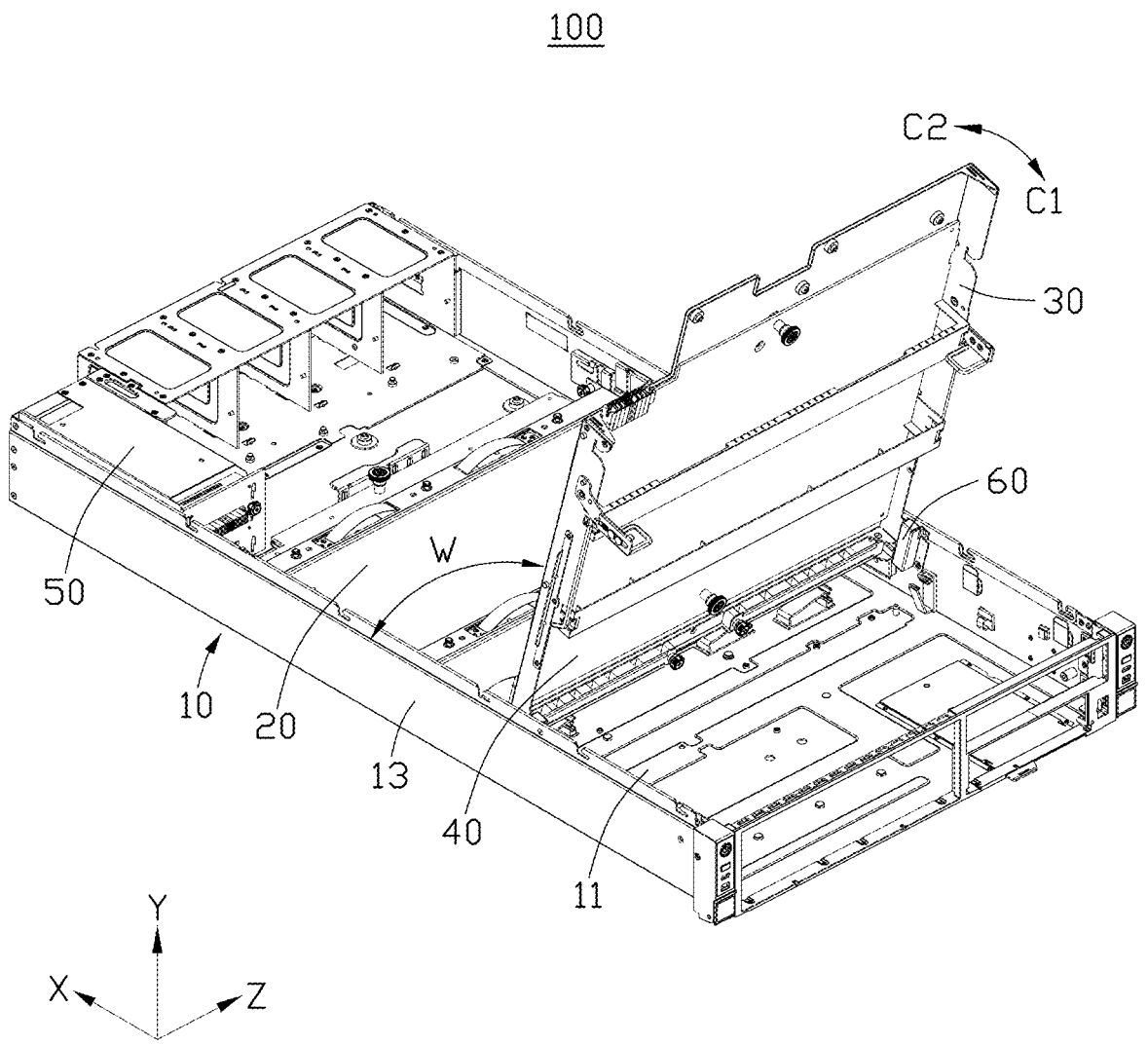
FIG. 4 is an isometric view of the server shown in FIG. 3, showing the bracket rotated up.

As shown in FIG. 3 and FIG. 4, when the bracket 30 is rotated up, the bracket 30 is rotated in direction C1 to expose the lower motherboard 20. When the bracket 30 is rotated down, the bracket 30 is rotated in direction C2 to layer the upper motherboard 40 above the lower motherboard 20.

In some embodiments, when the bracket 30 rotates up in direction C1 to the maximum angle W, the angle between the lower motherboard 20 and the upper motherboard 40 is greater than 90°, so the lower motherboard 20 is fully exposed.

Figure 5:
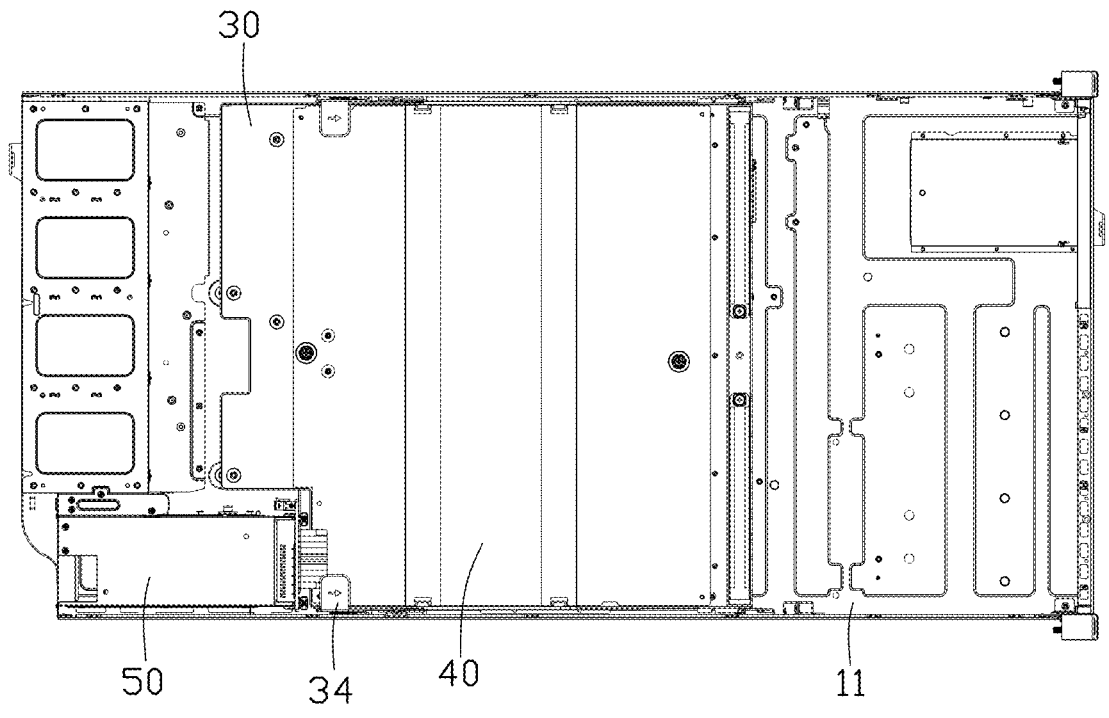
FIG. 5 is a top view of the server shown in FIG. 3, showing an upper motherboard connected to an electronic device.
Figure 5:
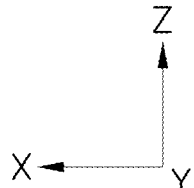
Figure 6:
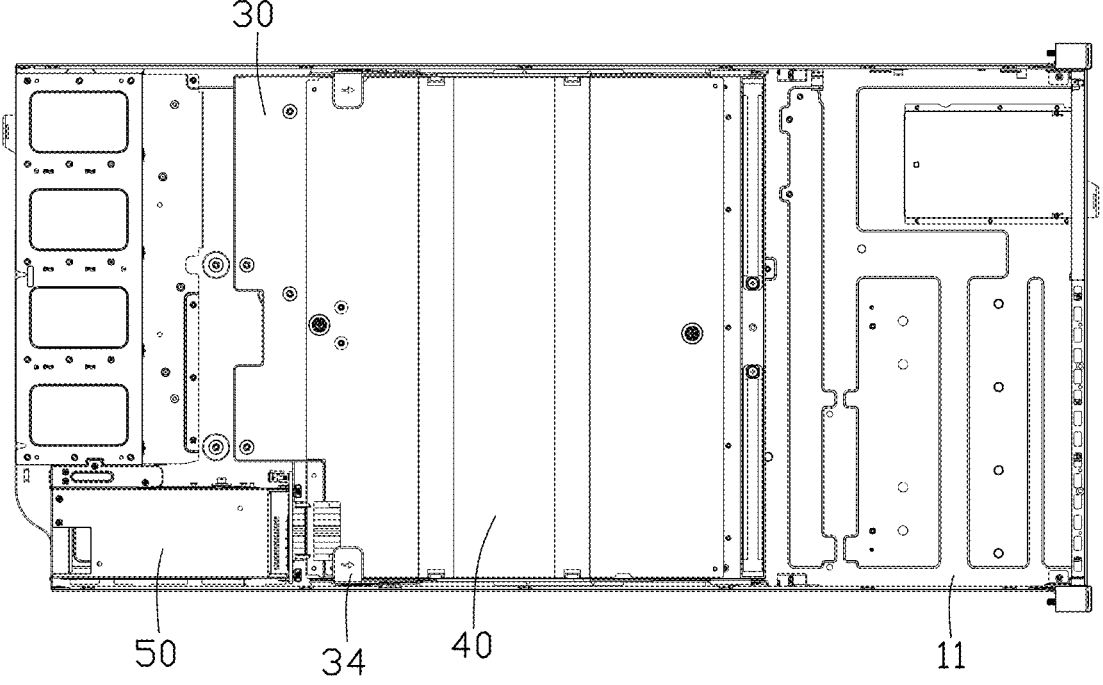
FIG. 6 is a top view of the server shown in FIG. 5, showing the upper motherboard disconnected with the electronic device.

As shown in FIG. 5, after the bracket 30 is moved towards the electronic device 50, the upper motherboard 40 is connected to the electronic device 50. As shown in FIG. 6, after the bracket 30 is moved away from the electronic device 50, the upper motherboard 40 is disconnected with the electronic device 50.

Figure 7:
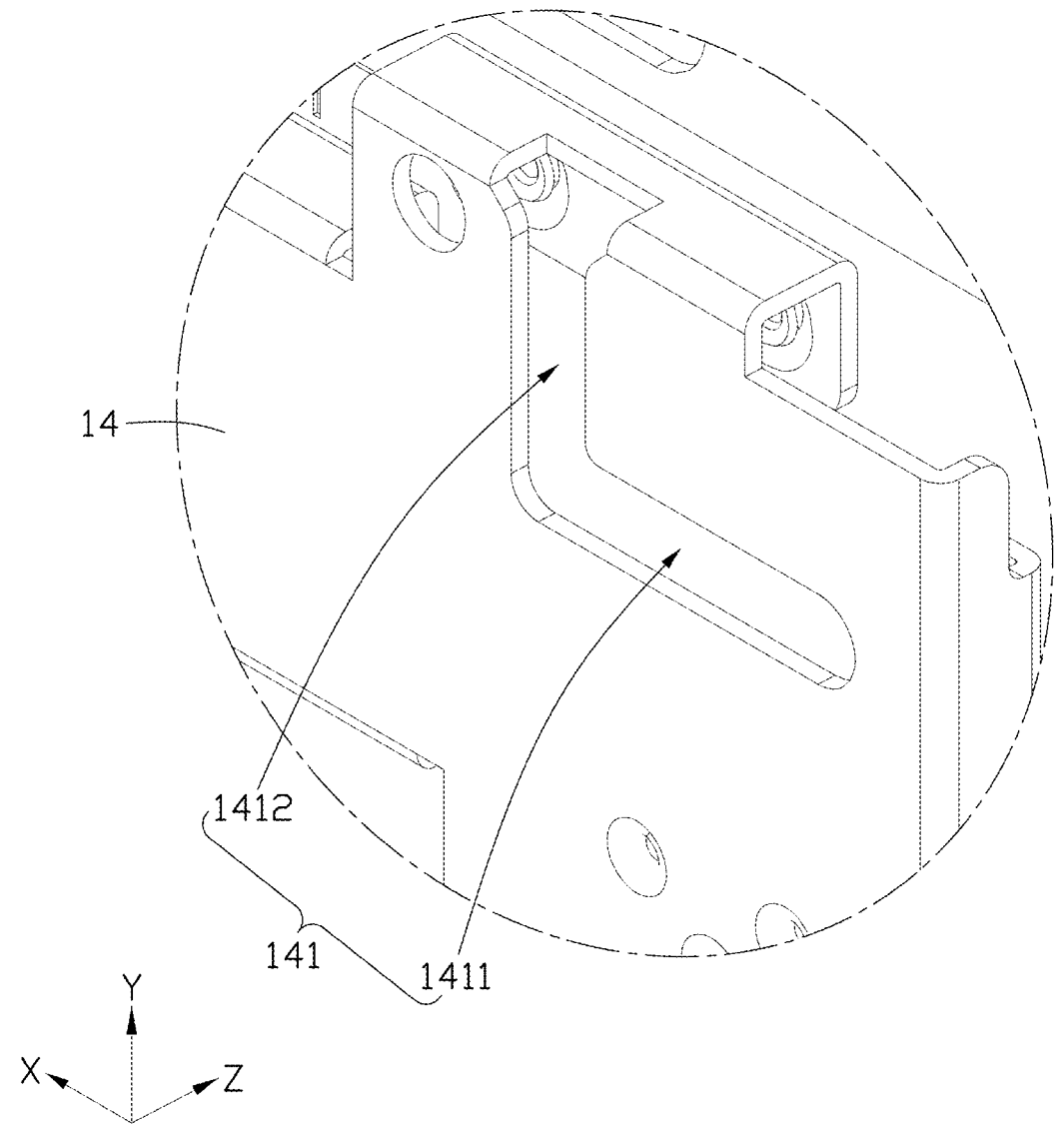
FIG. 7 is an enlarged view of area A shown in FIG. 2.
Figure 8:
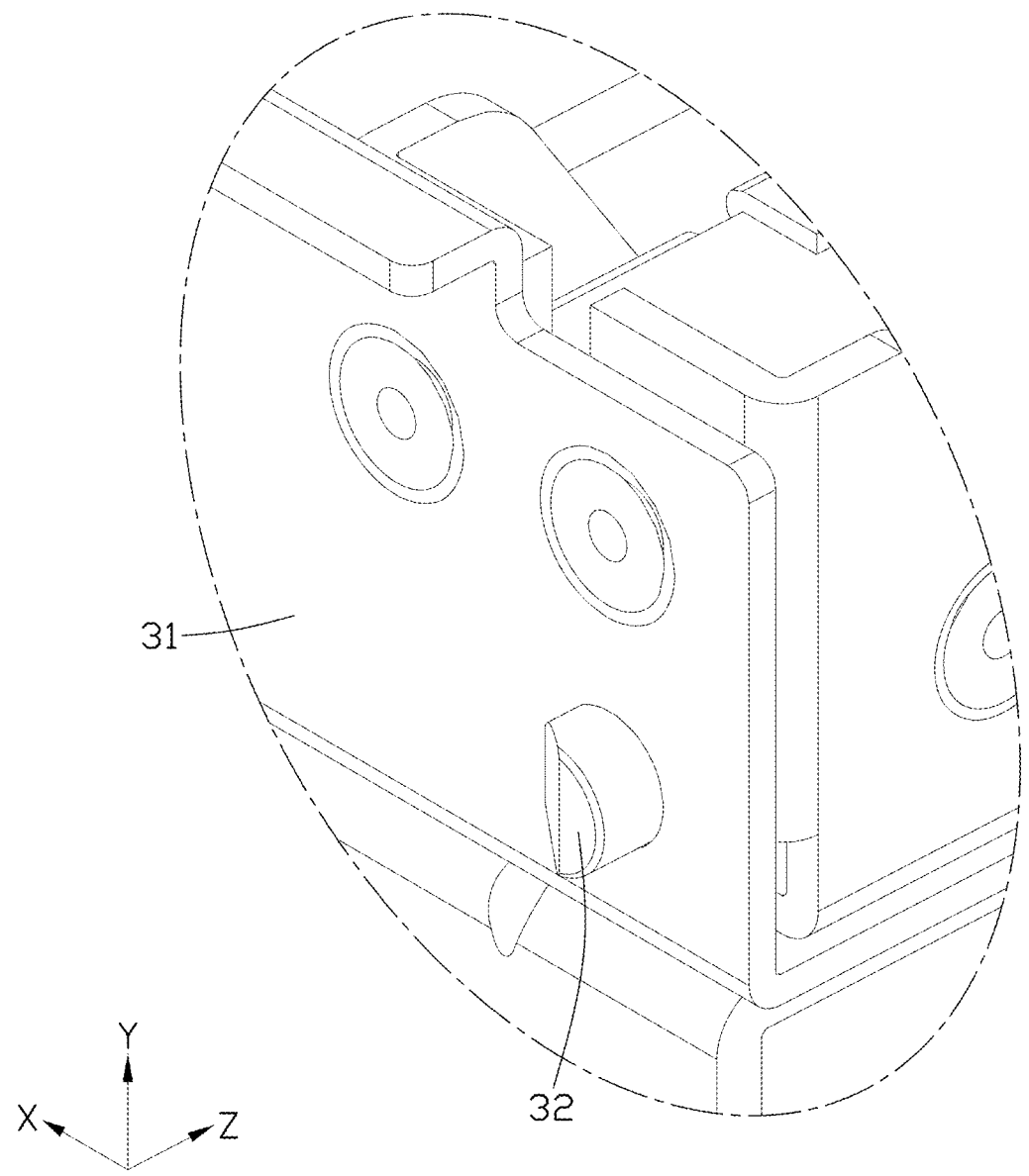
FIG. 8 is an enlarged view of area B shown in FIG. 2.

In some embodiments, as shown in FIG. 2, FIG. 7, and FIG. 8, the chassis 10 further includes two inner sheets 14. Each of the two inner sheets 14 is located on each of the two side sheets 13. Each of the two inner sheets 14 defines a sliding groove 141 and the sliding groove 141 defines a horizontal section 1411 and a vertical section 1412. The horizontal section 1411 and vertical section 1412 are connected, the horizontal section 1411 extends in direction X, and the vertical section 1412 extends in direction Y. A top end of the vertical section 1412 extends through the inner sheet 14. The bracket 30 includes a carrier body 31 and two shafts 32. The carrier body 31 carries the upper motherboard 40. The two shafts 32 are located on two opposite sides of the carrier body 31, respectively. Each of the two shafts 32 enters each sliding groove 141 through the top end of the vertical section 1412 and is slidable in each sliding groove 141. When the two shafts 32 slide in the horizontal sections 1411, the bracket 30 moves in direction X relative to the chassis 10, for guiding the upper motherboard 40 to connect or disconnect the electronic device 50. Also, the two shafts 32 is rotatable in the horizontal sections 1411, so the bracket 30 can rotate relative to the chassis 10.

Figure 9:
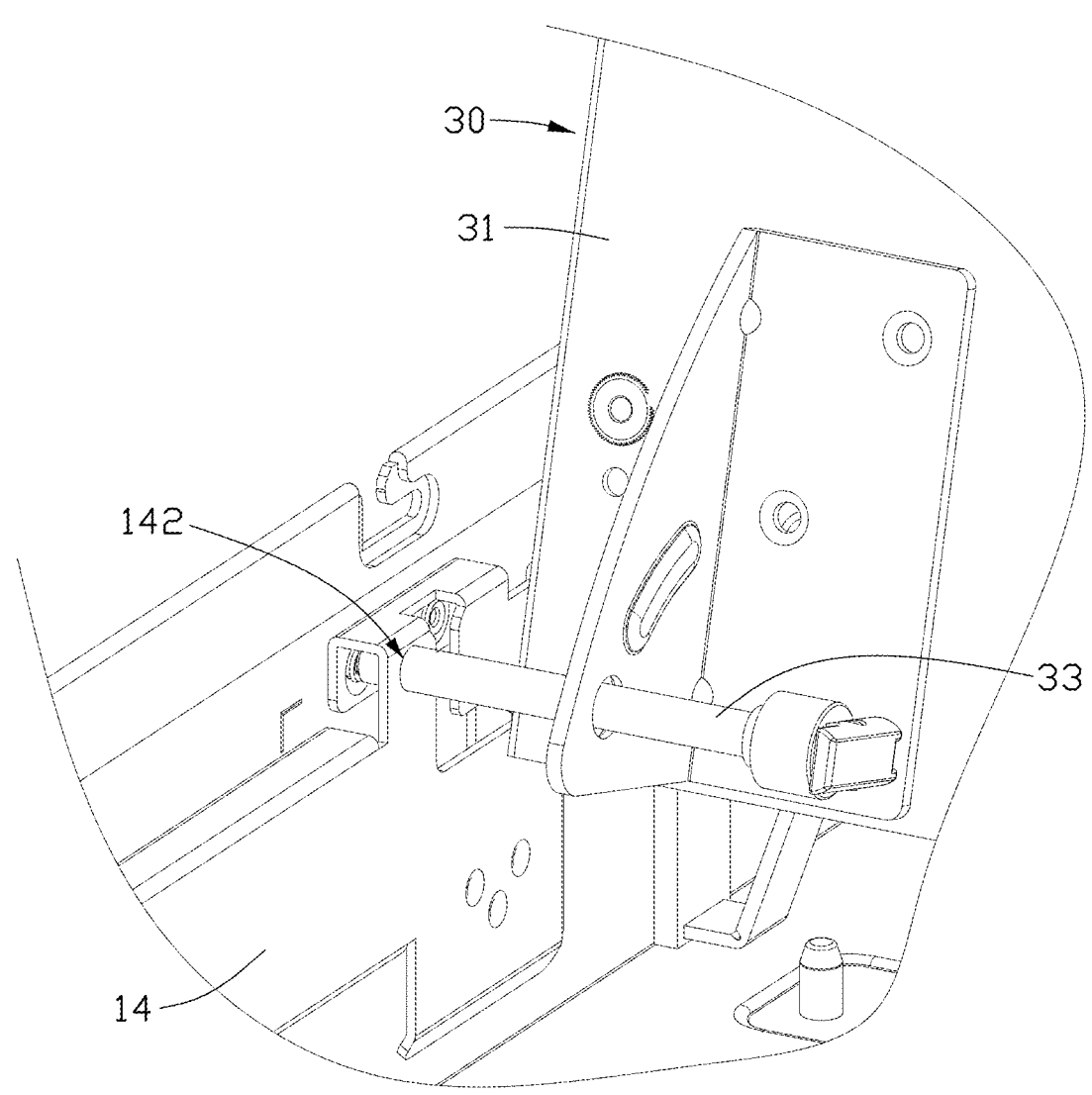
FIG. 9 is an isometric view of the server shown in FIG. 4, showing the bracket rotated up and a pin aligned with a positioning hole.

In some embodiments, as shown in FIG. 4 and FIG. 9, the bracket 30 further includes two pins 33 located on the two opposite sides of the carrier body 31, respectively. Each inner sheet 14 has a positioning hole 142. When the bracket 30 is rotated up, each of the two pins 33 moves into each positioning hole 142 to position the bracket 30, keeping the lower motherboard 20 stay exposed.

In some embodiments, each pin 33 can be a telescopic pole capable of adjusting the length. For example, each pin 33 includes two nested sections, and one of which can extend or retract from the other.

Figure 10:
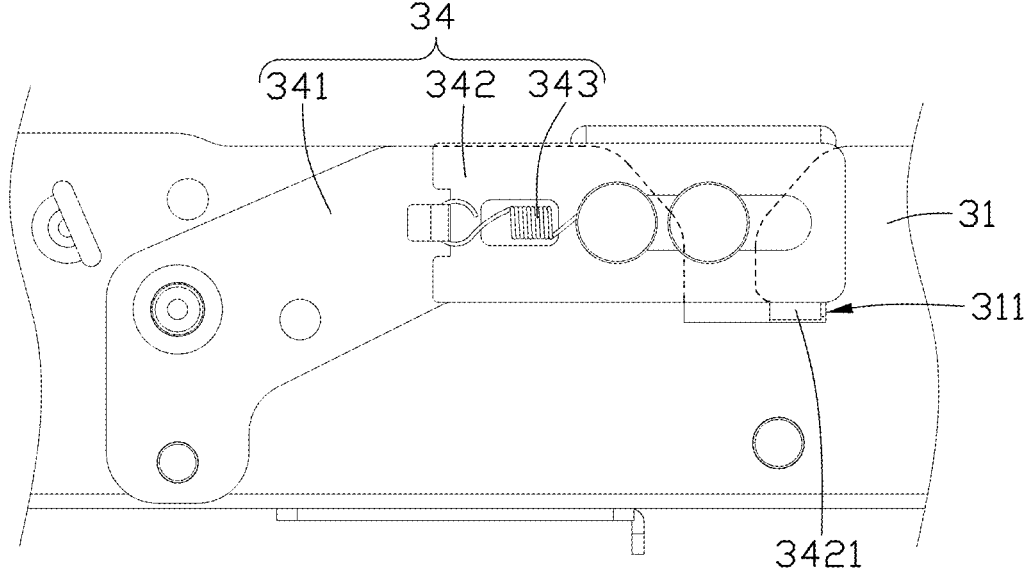
FIG. 10 is a side view of an embodiment of a bracket and a handle according to the present disclosure, showing the handle rotated down and locked.
Figure 10:
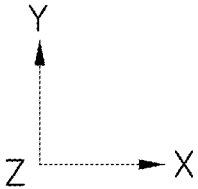
Figure 11:
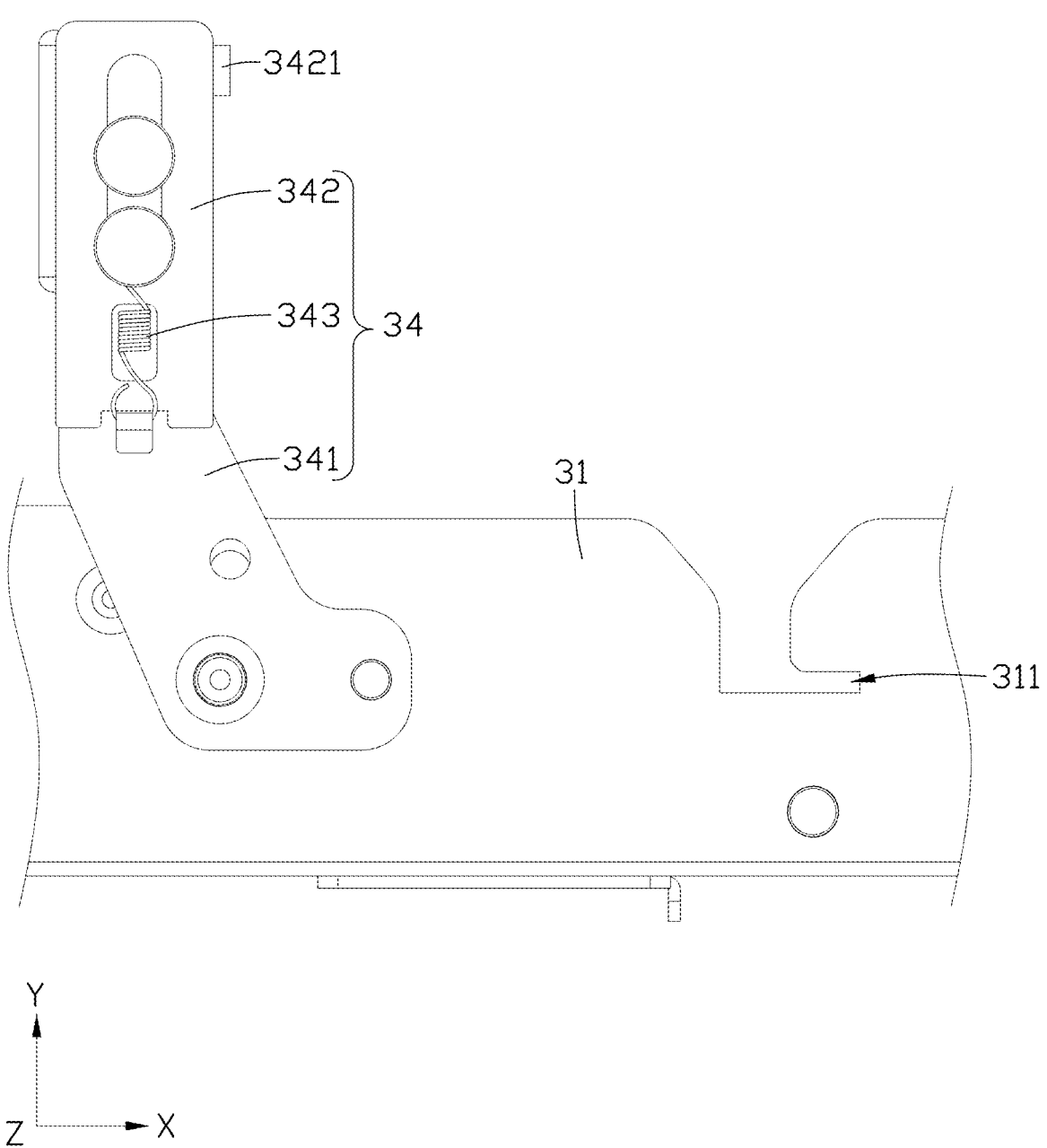
FIG. 11 is a side view of the bracket and the handle shown in FIG. 10, showing the handle rotated up.

In some embodiments, as shown in FIG. 10 and FIG. 11, the bracket 30 further includes a handle 34. The handle 34 is rotatably mounted to the carrier body 31. After the top sheet 12 is removed from the two side sheets 13, users can rotate up the handle 34 for moving the bracket 30 in direction X and pulling the bracket 30 up. After users rotate down handle 34, the top sheet 12 can be mounted back on the two side sheets 13.

In some embodiments, as shown in FIG. 10 and FIG. 11, the carrier body 31 has a locking slot 311, and the handle 34 includes a side arm 341 and a locking sheet 342. The side arm 341 is rotatably mounted to the carrier body 31. The locking sheet 342 is movably mounted on the side arm 341. The locking sheet 342 has a bent sheet 3421. When the handle 34 is rotated down, the side arm 341 and the locking sheet 342 are also rotated down, then the bent sheet 3421 is aligned with the locking slot 311, then the locking sheet 342 can be slid towards the locking slot 311 in direction X, until the bent sheet 3421 is inserted into the locking slot 311, to lock the side arm 341 from rotating, so the handle 34 is locked from rotating. When the handle 34 needs to be rotated up, users pull the locking sheet 342 to move the bent sheet 3421 out of the locking slot 311, to allow the side arm 341 to rotate, so to allow the handle 34 to rotate.

In some embodiments, as shown in FIG. 10 and FIG. 11, the handle 34 further includes a spring 343, and the spring 343 connects the side arm 341 and the locking sheet 342. The spring 343 is used for pushing the locking sheet 342. When the bent sheet 3421 is aligned with the locking slot 311, the spring 343 pushes the locking sheet 342 to automatically insert the bent sheet 3421 into the locking slot 311.

In some embodiments, as shown in FIG. 10 and FIG. 11, when users pull the locking sheet 342 to move the bent sheet 3421 out of the locking slot 311, the locking sheet 342 also pushes the carrier body 31 to move in same direction to disconnect the upper motherboard 40 with the electronic device 50.

In some embodiments, as shown in FIG. 4, the cabinet 200 further includes a block 60, and the block 60 is located on the chassis 10.

When the bracket 30 is rotated to the maximum angle W which is greater than 90 degrees relative to the chassis 10, the block 60 stops the bracket 30 from rotating, and the block 60 can also support the bracket 30, which is helpful to free users' hands to maintain the lower motherboard 20.

Figure 12:
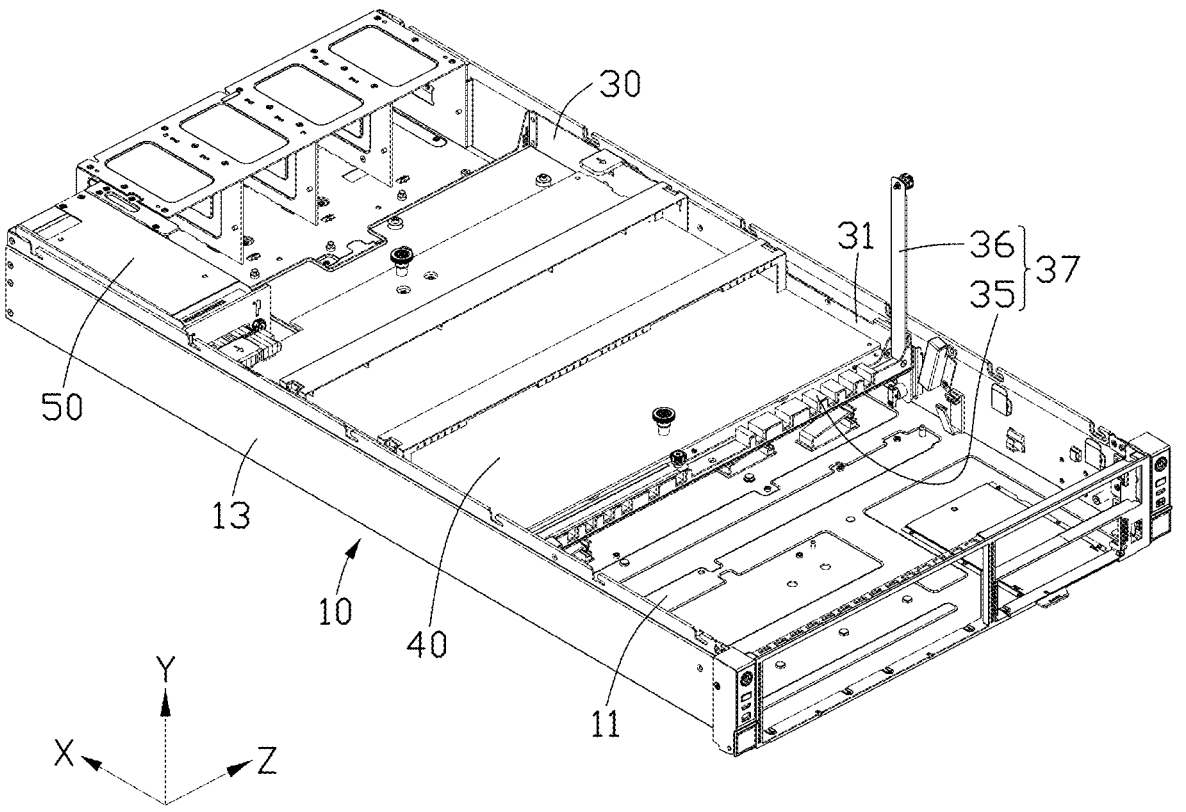
FIG. 12 is an isometric view of the server shown in FIG. 3, showing an open cable clamp.

In some embodiments, as shown in FIG. 12, the bracket 30 further includes a cable clamp 37, and the cable clamp 37 includes a plurality of protrudes 35 and a pressing plate 36. Wires of the server 100 pass through gaps between two adjacent protrudes 35. The pressing plate 36 is used for pressing the wires in the gaps to clamp the wires.

In some embodiments, as shown in FIG. 2, the cabinet 200 further includes a support 70 and a buffer 80. The support 70 is located on the chassis 10 and is above the lower motherboard 20. The buffer 80 is located on the support 70. The support 70 and the buffer 80 are used for supporting the bracket 30 when the bracket 30 is rotated down. The support 70 can protect the lower motherboard 20, and the buffer 80 takes a shock-absorbing function for the bracket 30 and the upper motherboard 40.

In some embodiments, the support 70 is located on the two inner sheets 14 or the two side sheets 13 by screws. The buffer 80 can be a metal spring, a compression spring, or a silicone pad and so on.

In some embodiments, the bracket 30 can also has a structure like the support 70 and the buffer 80 above the upper motherboard 40.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A cabinet comprising:

a chassis comprising a bottom sheet configured for carrying a lower motherboard and an electronic device; and a bracket located on the chassis and configured for carrying an upper motherboard, the bracket being rotatable and slidable relative to the chassis, wherein the bracket is above the bottom sheet, when the bracket is rotated up, the lower motherboard is exposed; when the bracket is rotated down, the upper motherboard is layered above the lower motherboard such that the bracket is slidable towards the electronic device to connect the upper motherboard with the electronic device;

wherein the chassis further comprises a top sheet and two side sheets, the two side sheets are located on two opposite sides of the bottom sheet, respectively, the top sheet is mounted on the two side sheets, the top sheet, the bottom sheet, and the two side sheets forms a cavity to accommodate the bracket, the lower motherboard, the upper motherboard, and the electronic device;

wherein the chassis further comprises two inner sheets, each of the two inner sheets is located on a respective side of the two side sheets, each of the two inner sheets defines a sliding groove and the sliding groove defines a horizontal section and a vertical section, a top end of the vertical section extends through the inner sheet; the bracket comprises a carrier body and two shafts, the carrier body is configured to carry the upper motherboard, the two shaft are located on two opposite sides of the carrier body, respectively, each of the two shafts enters a respective sliding groove through the top end of the vertical section and is slidable in the respective sliding groove;

wherein the bracket further comprises a handle located on the carrier body, and the handle is rotatable relative to the carrier body, after the top sheet is removed from the two side sheets, the handle is rotatable up for pulling the bracket up, and after the handle is rotated down, the top sheet is mountable on the two side sheets;

wherein the handle comprises a side arm and a locking sheet, the side arm is rotatably mounted on the carrier body, the locking sheet is slidably mounted on the side arm, a bent sheet is formed on the locking sheet, the carrier body defines a locking slot configured for receiving the bent sheet, wherein in response to the handle been rotated down, the side arm and the locking sheet been rotated down and the bent sheet been aligned with the locking slot, the locking sheet is slidable towards the locking slot and insertable into the locking slot, thereby locking the side arm and the handle from rotating.

2. The cabinet of claim 1, wherein the bracket further comprises two pins located on the two opposite sides of the carrier body, respectively, each of the two inner sheets further defines a positioning hole, when the bracket rotates up, each of the two pins moves into each positioning hole to position the bracket; wherein each of the two pins is a telescopic pole.

3. The cabinet of claim 1, wherein the handle further comprises a spring, the spring connects the side arm and the locking sheet, when the handle is rotated down, the spring pushes the locking sheet towards the locking slot to insert the bent sheet into the locking slot.

4. The cabinet of claim 1, wherein the bracket further comprises a cable clamp, the cable clamp comprises a plurality of protrudes and a pressing plate, wires pass through gaps between two adjacent ones of the plurality of protrudes, the pressing plate is configured for pressing the wires in the gaps to clamp the wires.

5. The cabinet of claim 1, wherein the cabinet further comprises a block, the block is mounted on the chassis, the bracket is rotatable greater than 90 degrees relative to the chassis, when the bracket is rotated to a maximum angle, the block is configured for stopping the bracket from rotating and supporting the bracket.

6. The cabinet of claim 1, wherein the cabinet further comprises a support and a buffer, the support is located on the chassis and is above the lower motherboard, the buffer is located on the support, the support and the buffer are configured for supporting the bracket when the bracket is rotated down.

7. A server comprising:

an electronic device;

a lower motherboard connected to the electronic device;

an upper motherboard; and a cabinet, the cabinet comprising:

a chassis comprising a bottom sheet configured for carrying the lower motherboard and the electronic device; and a bracket located on the chassis and configured for carrying the upper motherboard, the bracket being rotatable and slidable relative to the chassis, wherein the bracket is above the bottom sheet, when the bracket is rotated up, the lower motherboard is exposed; when the bracket is rotated down, the upper motherboard is layered above the lower motherboard such that the bracket is slidable towards the electronic device to connect the upper motherboard with the electronic device;

wherein the chassis further comprises a top sheet and two side sheets, the two side sheets are located on two opposite sides of the bottom sheet, respectively, the top sheet is mounted on the two side sheets, the top sheet, the bottom sheet, and the two side sheets forms a cavity to accommodate the bracket, the lower motherboard, the upper motherboard, and the electronic device;

wherein the chassis further comprises two inner sheets, each of the two inner sheets is located on a respective side of the two side sheets, each of the two inner sheets defines a sliding groove and the sliding groove defines a horizontal section and a vertical section, a top end of the vertical section extends through the inner sheet; the bracket comprises a carrier body and two shafts, the carrier body is configured to carry the upper motherboard, the two shaft are located on two opposite sides of the carrier body, respectively, each of the two shafts enters a respective sliding groove through the top end of the vertical section and is slidable in the respective sliding groove;

wherein the bracket further comprises a handle located on the carrier body, and the handle is rotatable relative to the carrier body, after the top sheet is removed from the two side sheets, the handle is rotatable up for pulling the bracket up, and after the handle is rotated down, the top sheet is mountable on the two side sheets;

wherein the handle comprises a side arm and a locking sheet, the side arm is rotatably mounted on the carrier body, the locking sheet is slidably mounted on the side arm, a bent sheet is formed on the locking sheet, the carrier body defines a locking slot configured for receiving the bent sheet, wherein in response to the handle been rotated down, the side arm and the locking sheet been rotated down and the bent sheet been aligned with the locking slot, the locking sheet is slidable towards the locking slot and insertable into the locking slot, thereby locking the side arm and the handle from rotating.

8. The server of claim 7, wherein the bracket further comprises two pins located on the two opposite sides of the carrier body, respectively, each of the two inner sheets further defines a positioning hole, when the bracket rotates up, each of the two pins moves into each positioning hole to position the bracket; wherein each of the two pins is a telescopic pole.

9. The server of claim 7, wherein the handle further comprises a spring, the spring connects the side arm and the locking sheet, when the handle is rotated down, the spring pushes the locking sheet towards the locking slot to insert the bent sheet into the locking slot.

10. The server of claim 7, wherein the bracket further comprises a cable clamp, the cable clamp comprises a plurality of protrudes and a pressing plate, wires pass through gaps between two adjacent ones of the plurality of protrudes, the pressing plate is configured for pressing the wires in the gaps to clamp the wires.

11. The server of claim 7, wherein the cabinet further comprises a block, the block is mounted on the chassis, the bracket is rotatable greater than 90 degrees relative to the chassis, when the bracket is rotated to a maximum angle, the block is configured for stopping the bracket from rotating and supporting the bracket.

12. The server of claim 7, wherein the cabinet further comprises a support and a buffer, the support is located on the chassis and is above the lower motherboard, the buffer is located on the support, the support and the buffer are configured for supporting the bracket when the bracket is rotated down.

* * * * *